(12) United States Patent
Ishida et al.

(10) Patent No.: US 7,394,277 B2
(45) Date of Patent: Jul. 1, 2008

(54) TESTING APPARATUS, TESTING METHOD, JITTER FILTERING CIRCUIT, AND JITTER FILTERING METHOD

(75) Inventors: Masahiro Ishida, Tokyo (JP); Kiyotaka Ichiyama, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 174 days.

(21) Appl. No.: 11/407,136

(22) Filed: Apr. 20, 2006

(65) Prior Publication Data

US 2007/0247181 A1    Oct. 25, 2007

(51) Int. Cl.
    *G01R 31/26* (2006.01)
(52) U.S. Cl. .................. 324/765; 702/69; 375/226
(58) Field of Classification Search .......... None
    See application file for complete search history.

(56) References Cited

U.S. PATENT DOCUMENTS

| 7,136,773 | B2 * | 11/2006 | Ishida et al. .......... 702/120 |
| 2005/0075810 | A1 * | 4/2005 | Laquai .......... 702/69 |
| 2007/0239388 | A1 * | 10/2007 | Ichiyama et al. .......... 702/117 |

FOREIGN PATENT DOCUMENTS

| JP | 2005-75573 A | 3/1993 |
| JP | 2003-27380 | 9/2003 |
| JP | 2005-49233 A | 2/2005 |
| WO | WO 2006-100745 A1 | 9/2006 |

OTHER PUBLICATIONS

Japan Patent Office. PCT International Search Report dated Jul. 17, 2007. International Application No.: PCTJP2007/058117. International Filing Date: Apr. 12, 2007. Japanese Language Translation. 3 pages.

* cited by examiner

*Primary Examiner*—Minh N Tang
(74) *Attorney, Agent, or Firm*—Sterne, Kessler, Goldstein & Fox P.L.L.C.

(57) ABSTRACT

There is provided a testing apparatus for evaluating a device-under-test, having an extracting section for extracting jitter components out of an output signal outputted out of the device-under-test, a filter for passing predetermined frequency components in the jitter components, a phase control section for controlling phase of the output signal based on the jitter components outputted out of the filter and an evaluating section for evaluating the device-under-test based on a signal outputted out of the phase control section.

18 Claims, 16 Drawing Sheets

TESTING APPARATUS, TESTING METHOD, JITTER FILTERING CIRCUIT, AND JITTER FILTERING METHOD

BACKGROUND OF THE INVENTION

1. Field of the Invention

The present invention relates to a testing apparatus, a testing method, a jitter filtering circuit and a jitter filtering method. More specifically, the invention relates to a testing apparatus for testing a device-under-test such as a semiconductor circuit.

2. Related Art

Conventionally, there has been a case of testing whether or not an electronic device such as a semiconductor circuit can correctly operate with an input signal having a predetermined eye opening. For example, a minimum eye opening called as an eye mask is specified as a characteristic which an electronic device having a serial I/O interface should have in order to guarantee quality of a signal outputted out of a transmitter or a receiver's tolerance to an input signal influenced by disturbance. Eye mask stipulated by PCI Express may be exemplified as the eye opening which the output signal of the transmitter should meet and the eye opening of the input signal that should guarantee that the receiver will normally operate.

Generally, the eye opening must be measured by taking characteristics of a clock recovery circuit of the receiver into account. It is because the receiver having the serial I/O interface for example recovers clock from a data signal transmitted from a transmitter and re-samples the data signal by using the recover clock.

FIG. 15 is a diagram showing a configuration of a conventional receiver 400. The receiver 400 receives a data signal transmitted from a device-under-test 200 on the transmitter side. A clock recovery circuit 410 generates recovered clock based on the data signal. A data sampler 420 re-samples the data signal corresponding to the recovered clock to generate recovered data.

FIG. 16 is a graph showing one exemplary filtering characteristic of the clock recovery circuit 410. When a signal-under-measurement is inputted to the clock recovery circuit 410, generated clock will have jitter transfer characteristic corresponding to the filtering characteristic. Then, when the signal-under-measurement is re-sampled by using the recovered clock, the recovered data result in containing jitter components having frequency characteristic obtained by subtracting frequency characteristic of the recovered clock from frequency characteristic of the jitter components contained in the signal-under-measurement.

Because the receiver 400 is thus influenced by the recovered clock whether or not it can correctly re-sample the data signal, the eye opening of the data signal must be measured by taking the characteristics of the clock recovery circuit 410 into account.

For example, PCI Express stipulates for the measurement of the eye opening of a data signal by using clock recovery function (see Equation (1)) which is a $1^{st}$-order high-pass filtering characteristics with 1.5 MHz cut-off frequency.

$$H_3(s) = \frac{s}{s+\omega_3}, \omega_3 = 2\pi \times 1.5 \times 10^6 \qquad \text{Eq. (1)}$$

Conventionally, testing of eye opening of a serial I/O interface such as PCI Express have been carried out by means of a real-time sampling oscilloscope or a testing apparatus having a clock recovery function. For example, the real-time oscilloscope samples a data signal-under-test at high speed and measures jitter in the data signal-under-test by using digital signal processing. Then, it applies the clock recovery function described above to the measured data to analyze an eye diagram.

The testing apparatus recovers clock from a data signal-under-test by using the clock recovery circuit and tests an eye diagram by comparing logic values of the data signal-under-measurement with the edges of the expected values at the clock used as timing reference.

However, the real-time oscilloscope has had a problem that it requires to accurately measure edge timings of the data signal-under-test and to sample the data signal-under-test at high sampling rate. Accordingly, it has had a problem that its apparatus cost is high. Still more, because it is difficult to be adapted to multi-channel, it is unable to test a multi-lane device having several tens to several hundreds of signal paths disposed in parallel. Furthermore, it is hard to use it in a device high volume-production test because it takes time in analyzing the eye diagram by using the data signal processing.

The testing apparatus using the clock recovery circuit also has to meet the requirements: a) assuring the accuracy of timing of the edges of the recovered clock and b) tracking the timing fluctuation by accurately generating recovered clock, so that its circuit complexity increases. Therefore, its apparatus cost has been high and it results in inflexibility of the function of the clock recovery circuit.

Accordingly, it has been desired to realize an apparatus capable of testing and evaluating devices having a high-speed and multi-lane serial I/O interface at low cost.

SUMMARY OF THE INVENTION

Accordingly, it is an object of the invention to provide a testing apparatus, a testing method, a jitter filtering circuit and a jitter filtering method, which are capable of solving the above-mentioned problems. This object may be achieved through the combination of features described in independent claims of the invention. Dependent claims thereof specify preferable embodiments of the invention.

That is, according to a first aspect of the invention, there is provided a testing apparatus for evaluating a device-under-test, having an extracting section for extracting jitter components out of an output signal outputted out of the device-under-test, a filter for passing predetermined frequency components in the jitter components, a phase control section for controlling phase of the output signal based on the jitter components outputted out of the filter and an evaluating section for evaluating the device-under-test based on a signal outputted out of the phase control section.

The phase control section may have a variable delay circuit for delaying and outputting the output signal by a value of delay based on the jitter components passed by the filter.

The filter may have almost same filtering characteristics with filtering characteristics specified for a clock recovery circuit to be used to receive the output signal from the device-under-test and when recovered clock of the output signal is generated by using the clock recovery circuit, may generate a signal corresponding to jitter components contained in the recovered clock, and the variable delay circuit may delay the output signal so as to remove the jitter components outputted out of the filter from the output signal.

The testing apparatus may further include a comparator for comparing a voltage value of a signal outputted out of the variable delay circuit with a predetermined reference voltage corresponding to a given timing signal and the evaluating section may evaluate the device-under-test based on the comparison result of the comparator.

The testing apparatus may further include a timing generating section for giving the timing signal at constant period.

The testing apparatus may further include a skew detector for detecting a phase difference of the output signal and the timing signal.

The testing apparatus may further include a plurality of extracting sections, filters, variable delay circuits and comparators in parallel and the skew detector may detect the phase difference in each of the comparators.

The extracting section may have a jitter demodulator for demodulating the jitter components out of the output signal.

The jitter modulator may have a delay circuit for outputting a delay signal obtained by delaying the output signal by a predetermined time and a phase detector for detecting a phase difference between the output signal and the delay signal and for outputting the jitter components jitter components based on the phase difference.

The jitter demodulator may have a pulse generator for outputting a pulse signal having a pulse width set in advance corresponding to edges of the output signal and a low-pass filter for demodulating the jitter components jitter components of the output signal by removing a cater frequency component of the output signal.

The jitter demodulator may have a pulse generator for outputting a pulse signal having a pulse width set in advance corresponding to edges of the output signal and an integrator for demodulating the jitter components of the output signal by integrating the pulse signal.

The output signal is a data signal and the jitter demodulator may have a complementary data generator for generating a complementary data signal whose data value transits at bit boundary where a data value of the data signal does not transit, an exclusive OR circuit for outputting an exclusive OR of the data signal ad the complementary data signal and a demodulating circuit for demodulating jitter of a signal outputted out of the exclusive OR circuit.

The filtering characteristics of the filter may be variable.

A gain of a value of delay of the output signal to the jitter components outputted out of the filter in the variable delay circuit may be variable.

A gain of the jitter components to be outputted to the inputted jitter components in the jitter demodulator may be variable.

According to a second aspect of the invention, there is provided a testing method for evaluating a device-under-test, having an extracting step of extracting jitter components out of an output signal outputted out of the device-under-test a filtering step of passing predetermined frequency components in the jitter components, a phase control step of controlling phase of the output signal based on the jitter components outputted in the filtering step and an evaluating step of evaluating the device-under-test based on a signal outputted in the phase control step.

According to a third aspect of the invention, there is provided a jitter filtering circuit for controlling phase of an input signal based on jitter components contained in the input signal, having an extracting section for extracting the jitter components out of the input signal, a filter for passing predetermined frequency components in the jitter components and a phase control section for controlling phase of the input signal based on the jitter components outputted out of the filter.

According to a fourth aspect of the invention, there is provided a jitter filtering method for controlling phase of an input signal based on jitter components contained in the input signal, having an extracting step of extracting the jitter components out of the input signal, a filtering step of passing predetermined frequency components in the jitter components and a phase control step of controlling phase of the input signal based on the jitter components outputted in the filtering step.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
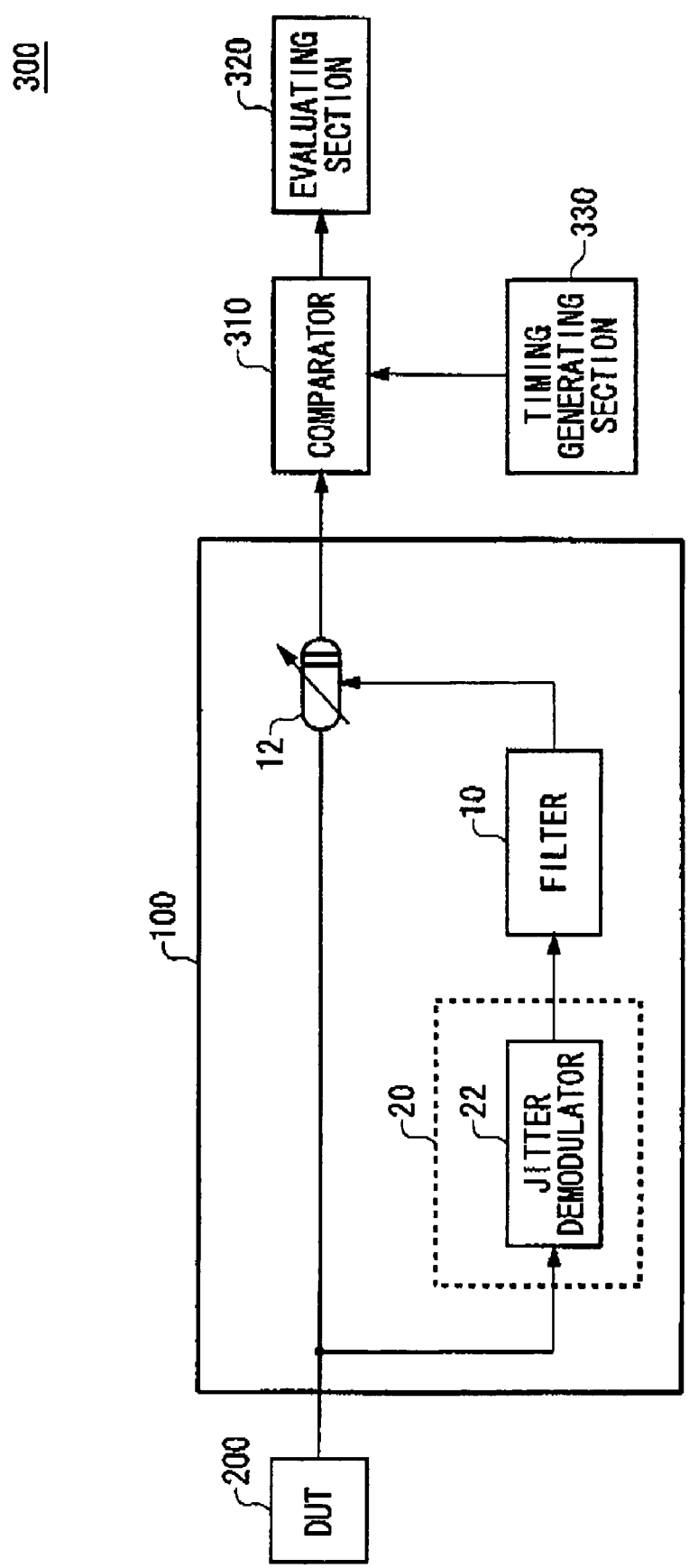
FIG. 1 is a diagram showing one exemplary configuration of a testing apparatus 300 according to an embodiment of the invention.

FIG. 1 is a diagram showing one exemplary configuration of a testing apparatus 300 according to au embodiment of the invention. The testing apparatus 300 is an apparatus for testing a device-under-test 200 such as a semiconductor circuit. And the testing apparatus 300 of the present embodiment tests the device based on an eye opening of an output signal of the device-under-test 200 without using a clock recovery circuit.

Figure 16:
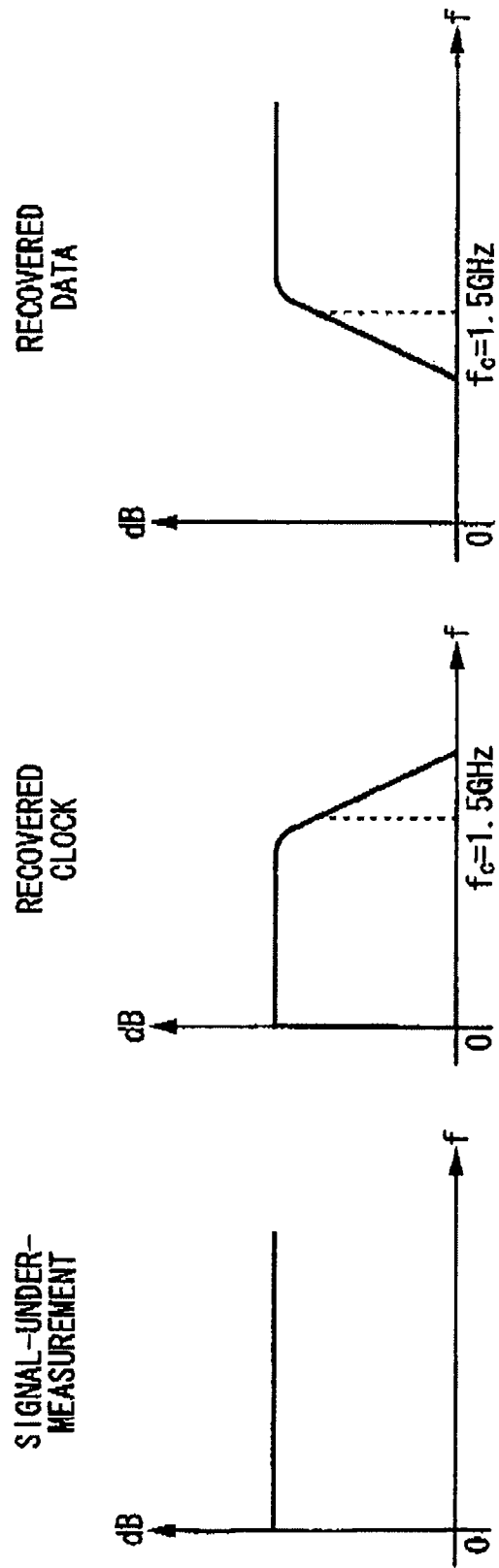
FIG. 16 is a graph showing one exemplary filtering characteristic of a clock recovery circuit 410.

When a signal-under-measurement is re-sampled by using the clock recovery circuit 410 as explained in connection with FIG. 16, jitter components contained in recovered clock is removed from jitter components contained in the signal-under-measurement. Accordingly, it is possible to detect the jitter components contained in recovered data to be generated, which corresponds to the jitter, when the clock recovery circuit 410 is used by detecting the jitter components contained in the recovered clock to be generated when the clock recovery circuit 41 were used and by subtracting the jitter components from the jitter components contained in the signal-under-measurement.

Therefore, it is possible to carry out the eye-opening related tests specified in PCI Express and others based on the jitter components without using the clock recovery circuit 410.

The testing apparatus 300 of this embodiment has a jitter filtering circuit 100, a comparator 310, an evaluating section 320 and a timing generating section 330. The jitter filtering circuit 100 controls phase of an output signal outputted out of the device-under-test 200 based on jitter components contained in the output signal. For example, the jitter filtering circuit 100 controls the phase of the output signal based on predetermined frequency components of the jitter components contained in the output signal.

The jitter filtering circuit 100 has an extracting section 20, a filter 10 and a variable delay circuit 12. The variable delay circuit 12 is one example of a phase control section of the invention.

The extracting section 20 has a jitter demodulator 22 and extracts the jitter components contained in the output signal of the device-under-test 200. The output signal is split and is fed into the extracting section 20 for example. The jitter demodulator 22 demodulates the jitter components out of the output signal. The jitter demodulator 22 may demodulate timing jitter or period jitter of the input signal for example. Configuration and operation of the jitter demodulator 22 will be described later in connection with FIGS. 3 through 10.

Figure 15:
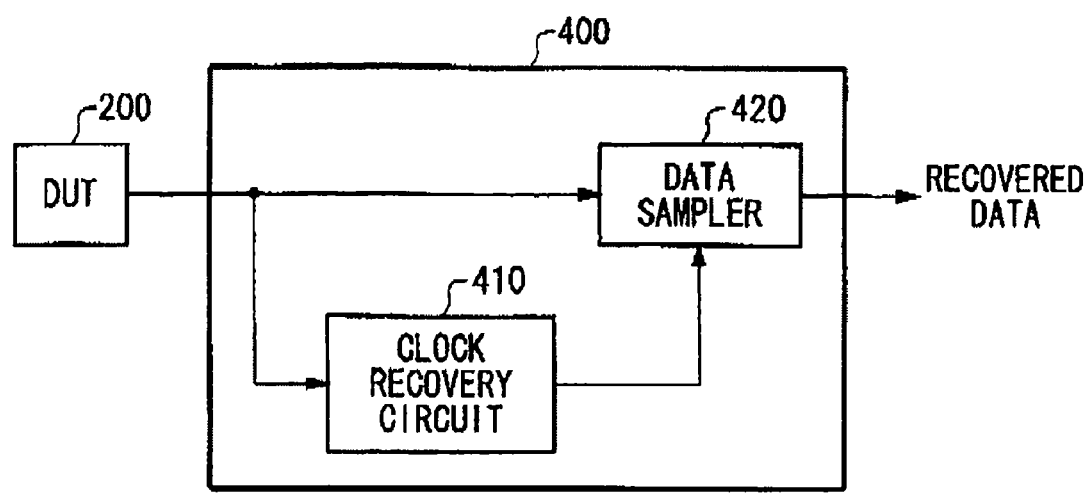
FIG. 15 is a diagram showing a configuration of a conventional receiver 400.

The filter 10 passes predetermined frequency components in the jitter components extracted by the extracting section 20. The filter 10 may have the almost same filtering characteristics with filtering characteristics specified for a clock recovery circuit to be used to receive the output signal from the device-under-test 200 for example. For example, the filter 10 may have filtering characteristics representing a transfer function of the clock recovery circuit. The clock recovery circuit is the clock recovery circuit 410 explained in connection with FIG. 15 for example.

That is, the filter 10 may have the almost same filtering characteristics with the filtering characteristics of the clock recovery circuit specified to be used in the measurement under a predetermined standard in measuring the eye opening of the output signal of the device-under-test 200. The standard may be that of PCI Express, XAUI and the like for example. The standard may be a standard conventionally used or may be a standard to be used in the future. That is, it may be a standard as long as it specifies the characteristics of the clock recovery circuit to be used in the measurement of eye opening of the output signal of the device-under-test 200.

When the standard is PCI Express for example, the filter 10 may have filtering characteristics representing a transfer function described later in Equation (6).

The variable delay circuit 12 controls the phase of the output signal based on the jitter components outputted out of the filter 10. For example, the variable delay circuit 12 may delay and output the output signal of the device-under-test 200 with a value of delay based on the jitter component. In the present embodiment, the variable delay circuit 12 removes the jitter components outputted out of the filter 10 from the jitter components of the output signal by controlling the phase of the output signal. Detail of the operation of the variable delay circuit 12 will be described later in connection with FIG. 2.

Such configuration allows the generation of the recovered data to be generated when the clock recovery circuit is used. That is, it is possible to detect the eye opening of the recovered data generated when the clock recovery circuit is used by detecting an eye opening of the output signal outputted out of the variable delay circuit 12.

The comparator 310 compares level of the output signal outputted out of the variable delay circuit 12 with predetermined reference level corresponding to a timing signal given at predetermined timing. The timing generating section 330 generates the timing signal and supplies it to the comparator 310. The timing generating section 330 may supply the timing signal to the comparator 310 with a constant period.

The evaluating section 320 evaluates the device-under-test 200 based on the signal outputted out of the variable delay circuit 12. The evaluating section 320 of the present embodiment detects the eye opening of the output signal of the device-under-test 200 based on the comparison result of the comparator 310.

The comparator 310 may compare the level of the output signal with the predetermined reference level at timing of different relative phase with respect to the output signal of the device-under-test 200. Then, the evaluating section 320 may detect the eye opening of the output signal by judging whether or not the comparison results of the respective relative phases coincide with predetermined expected results.

Figure 2:
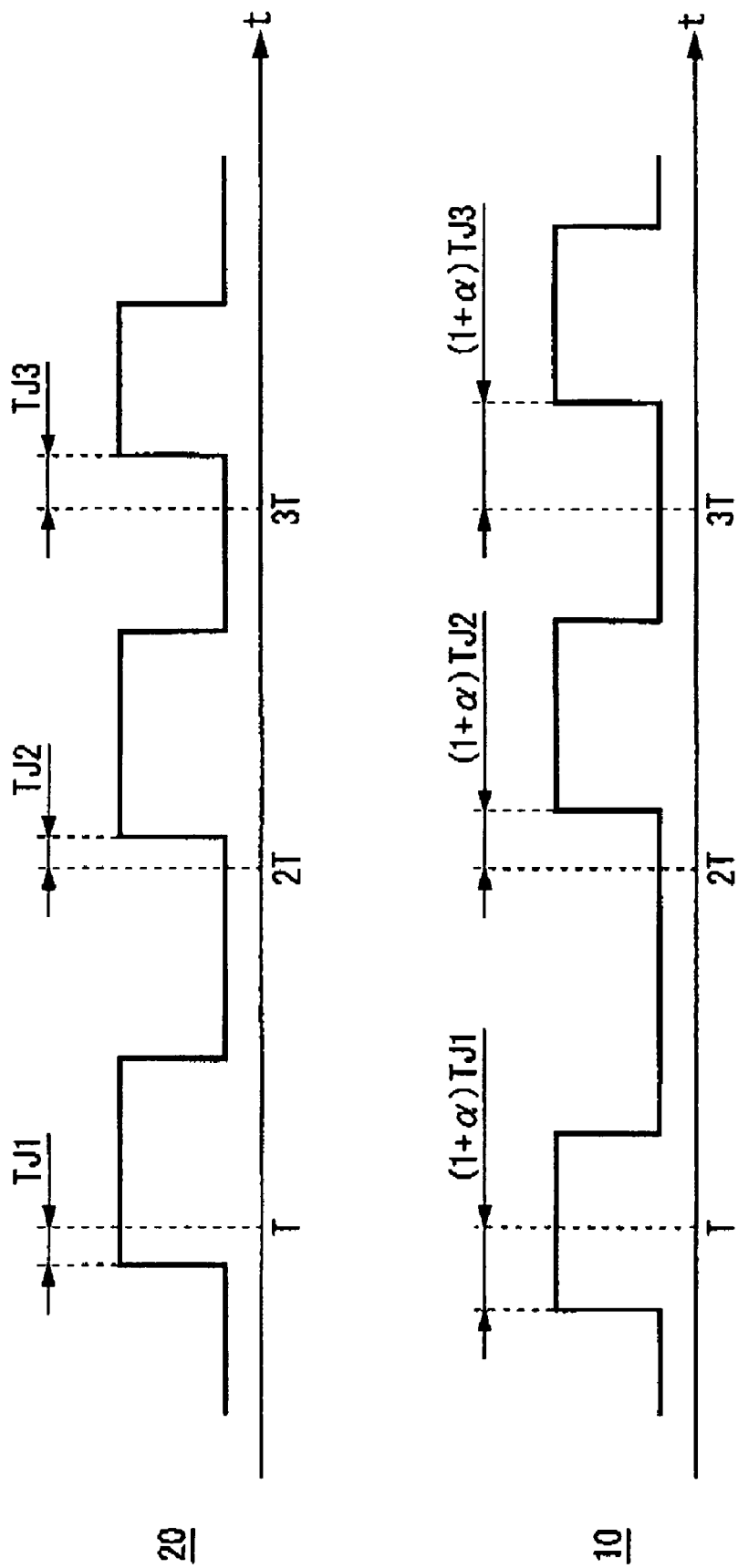
FIG. 2 is a chart showing one exemplary waveform of an input signal inputted to an extracting section 20 and of an output signal outputted out of a variable delay circuit 12.

FIG. 2 is a chart showing one exemplary waveform of the input signal inputted to the extracting section 20 and of the output signal outputted out of the variable delay circuit 12. In FIG. 2, times T, 2T, 3T, . . . represent ideal timing where the input signal should have their edges. That is, T represents the period of the input signal. T may be also a data rate of the input signal.

Due to the jitter components contained in the input signal, phase of each edge of the input signal is shifted from the ideal timing. For example, a first edge (that corresponds to time T) of the input signal is shifted by TJ1 from the ideal timing and a second edge (that corresponds to time 2T) is shifted by TJ2 from the ideal timing. The extracting section 20 detects the phase shift of each edge from the ideal timing. The extracting section 20 may detect the phase shift in each period of the input signal.

Although the extracting section 20 detects the phase shift of a rising edge of each pulse of the input signal in this example, it may also detect a phase shift of a falling edge of each pulse or may detect phase shifts of rising and falling edges in another example. The extracting section 20 may also detect a period shift of each period from the ideal period T of the input signal per each period.

When a value of delay in the variable delay circuit 12 is controlled based on the jitter components extracted by the extracting section 20, jitter components contained in an output signal of the variable delay circuit 12 equals to the amplified or attenuated jitter components contained in the output signal of the device-under-test 200.

For example, phase of an edge, such as the second edge, delays from the ideal timing 2T. The value of jitter TJ2 is amplified when the value of delay to that edge is increased corresponding to the value of jitter TJ2; This introduces the phase delay of the edge further.

When phase of an edge, such as the first edge, is in advance of the ideal timing T, the phase of that edge can be advanced further and the value of jitter TJ1 is amplified when the value of delay to that edge is decreased corresponding to the value of jitter TJ1.

As shown in FIG. 2, an amplification factor of the jitter components in the variable delay circuit 12 may be expressed by 1 +α. Here, α is determined by gains of the jitter demodulator 22 and the variable delay circuit 12. That is, when a gain of level of a control signal outputted out of the jitter demodulator 22 to a value of jitter of the jitter components inputted to the jitter demodulator 22 is $K_{JD}$ and a gain of a value of delay in the variable delay circuit 12 to the level of the control signal is $K_{VD}$, $α=K_{JD} \times K_{VD}$. However, a gain in the filter 10 is not taken into account here.

If $α \geq 0$, the jitter components of the input signal is amplified and if $α<0$, the jitter components of the input signal is attenuated. When α is −1 in particular, the jitter components of the input signal is cancelled.

The jitter filtering circuit 100 of this example is set so that the product of the gains of the jitter demodulator 22 and the variable delay circuit 12 becomes −1. Then, the jitter components outputted out of the filter 10 may be removed from the jitter components of the output signal of the variable delay circuit 12 by making the jitter components of predetermined frequencies pass through the filter 10.

Since the filter 10 has the filtering characteristics corresponding to the characteristics of the clock recovery circuit, it is possible to estimate a measured resultant recovered data to be generated when the clock recovery circuit is used by measuring the output signal of the variable delay circuit 12.

Still more, a different value of delay may be set in each period of the input signal in the variable delay circuit 12. The extracting section 20 and the filter 10 may control the value of delay of the variable delay circuit 12 in the corresponding period of the input signal corresponding to a value of jitter of the predetermined frequency components detected in each period of the input signal.

Still more, it is preferable to set a predetermined value of delay for the variable delay circuit 12 as an initial value of delay. That is, the variable delay circuit 12 delays jitter-free edges based on the initial value of delay. Thereby, even when phase of an edge is in advance of the ideal timing, the phase of the edge may be advanced further by reducing the value of delay.

Preferably, the value of delay in the variable delay circuit 12 also varies linearly corresponding to the level of the given control signal. That is, preferably the value of delay τ in the variable delay circuit 12 is expressed by Equation (2):

$$\tau = \tau_0 + K_{VD} \cdot V_{CTRL} \qquad \text{Eq. (2)}$$

Where, $\tau_0$ is the initial value of delay described above, $K_{VD}$ is the gain in the variable delay circuit 12 and $V_{CTRL}$ is the level of the control signal.

The operation of the jitter filtering circuit 100 described above will be explained below by using equations. The jitter demodulator 22 is a circuit for demodulating and outputting jitter out of a given signal and demodulates jitter components in the nearby carrier frequency of the signal into a base band signal for example. The jitter components $V_{JD}$ outputted out of the jitter demodulator 22 may be expressed by Equation (3):

$$V_{JD} = K_{JD} \cdot \Delta \emptyset_{IN} \qquad \text{Eq. (3)}$$

Where, $K_{JD}$ denotes the gain in the jitter demodulator 22 and $\Delta \phi_{IN}$ denotes the jitter components contained in the output signal of the device-under-test 200.

The jitter components $V_{JD}$ outputted out of the jitter demodulator 22 are inputted to the filter 10. Because the filter 10 has the characteristics corresponding to a transfer function $H_{CR}(s)$ of the specified clock recovery circuit, the control signal $V_{CTRL}$ outputted out of the filter 10 may be expressed by Equation (4):

$$V_{CTRL} = H_{CR}(s) \cdot V_{JD} = H_{CR}(s) \cdot K_{JD} \cdot \Delta \phi_{IN} \qquad \text{Eq. (4)}$$

From Equations (2) and (4), the timing $\Delta \phi_{IN} + \tau$ of the output signal of the variable delay circuit 12 may be given by Equation (5):

$$\begin{aligned} \Delta \phi_{IN} + \tau &= \Delta \phi_{IN} + (\tau_0 + K_{VD} \cdot V_{CTRL}) \\ &= \Delta \phi_{IN} + (\tau_0 + K_{VD} \cdot H_{CR}(s) \cdot K_{JD} \cdot \Delta \phi_{IN}) \\ &= \tau_0 + (1 + K_{VD} \cdot H_{CR}(s) \cdot K_{JD}) \cdot \Delta \phi_{IN} \end{aligned} \qquad \text{Eq. (5)}$$

The transfer function of the clock recovery circuit may be expressed by Equation (6):

$$H_{CR}(s) = 1 - H(s) \qquad \text{Eq. (6)}$$

Where, H(s) denotes a clock recovery function of the clock recovery circuit.

Accordingly, the jitter components $\Delta \phi_{OUT}$ contained in the output signal of the variable delay circuit 12 may be expressed by Equation (7):

$$\begin{aligned} \Delta \phi_{OUT} &= (1 + K_{VD} \cdot K_{JD} \cdot H_{CR}(s)) \cdot \Delta \phi_{IN} \\ &= (1 + K_{VD} \cdot K_{JD} \cdot (1 - H(s))) \cdot \Delta \phi_{IN} \end{aligned} \qquad \text{Eq. (7)}$$

The jitter components contained in the output signal of the variable delay circuit 12 turns out to be $H(s) \cdot \Delta \phi_{IN}$ by setting as $K_{VD} \cdot K_{JD} = -1$ in Equation (7) and jitter components in which the inputted jitter components are multiplied with the clock recovery function may be obtained.

It is possible to measure the eye diagram using the clock recovery function by measuring such signal corresponding to the timing signal having no fluctuation of timing, i.e., to the timing signal having a constant period.

The jitter filtering circuit 100 also detects timing jitter of k-th data transition of the inputted signal and controls timing of k-th data transition of the input signal based on the jitter component. Therefore, the jitter demodulator 22 and the filter 10 need to detect the predetermined frequency components of the jitter components in the k-th data transition and to control the value of delay in the variable delay circuit 12 before the variable delay circuit 12 outputs the k-th data transition.

To that end, the jitter filtering circuit 100 may further include means for delaying the timing for inputting the input signal to the variable delay circuit 12 corresponding to a time necessary for detecting the jitter components in the jitter demodulator 22 and the filter 10. For example, the jitter filtering circuit 100 may further include a delay circuit of a predetermined value of delay at a pre-stage of the variable delay circuit 12.

Still more, when the variable delay circuit 12 has a configuration in which a plurality of delay elements is connected in series, the variable delay circuit 12 may vary the value of delay to the input signal by varying the value of delay of post-stage delay elements without varying the value of delay of a predetermined number of pre-stage delay elements. Preferably, the fixed value of delay of the predetermined number of pre-stage delay elements is greater than a time necessary for the jitter demodulator 22 and the filter 10 to demodulate the predetermined frequency components of the jitter component.

Such configuration allows the phase of the k-th data transition of the input signal to be controlled corresponding to the jitter components in the k-th data transition of the input signal.

Still more, the filtering characteristics of the filter 10 may be varied. For example, the filtering characteristics of the filter 10 may be set corresponding to the characteristics of the clock recovery circuit specified by the predetermined standard.

Furthermore, the gain of the value of delay to the jitter components in the variable delay circuit 12 may be varied. Still more, the gain of the outputted jitter components to the inputted jitter components of the jitter demodulator 22 may be varied. For example, the gains of the variable delay circuit 12 and the jitter demodulator 22 may be arbitrarily set under the condition that the product of the gains of the variable delay circuit 12 and the jitter demodulator 22 becomes −1.

Figure 3:
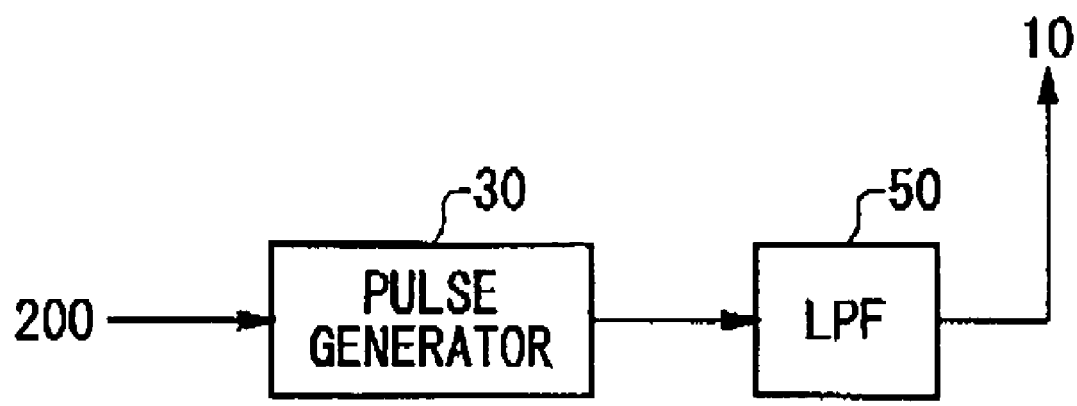
FIG. 3 is a diagram showing one exemplary configuration of a jitter demodulator 22.

FIG. 3 is a diagram showing one exemplary configuration of the jitter demodulator 22. The jitter demodulator 22 of this example is a circuit for demodulating period jitters of an inputted signal and has a pulse generator 30 and a low-pass filter 50.

The pulse generator 30 outputs a pulse signal having a pulse width set in advance corresponding to edges of the input signal. The low-pass filter 50 demodulates the period jitter of the input signal by removing a carrier frequency component of the input signal from the pulse signal.

Figure 4:
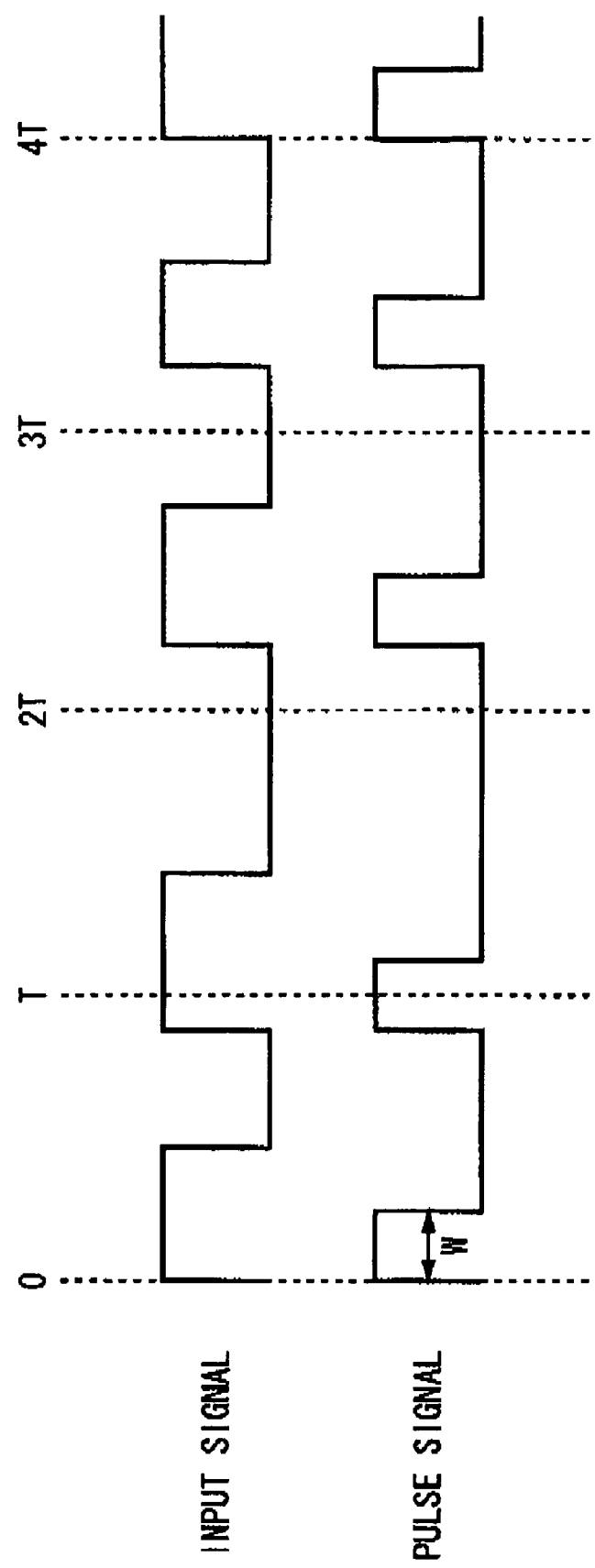
FIG. 4 is a chart showing one exemplary operation of a pulse generator 30 explained in FIG. 3.

FIG. 4 is a chart showing one exemplary operation of the pulse generator 30 explained in FIG. 3. In this example, the pulse generator 30 outputs a pulse signal having a pulse width W set in advance corresponding to rising edges of the input signal.

It is possible to generate a control signal corresponding to period jitter of the input signal by removing a carrier frequency component of the input signal from such pulse signal. The jitter demodulator 22 may further include a sample-and-hold circuit for sampling and holding level of the control signal outputted out of the low-pass filter 50 with period of the input signal and for supplying it to the variable delay circuit 12. It allows the period jitter to be more accurately amplified or attenuated.

Figure 5:
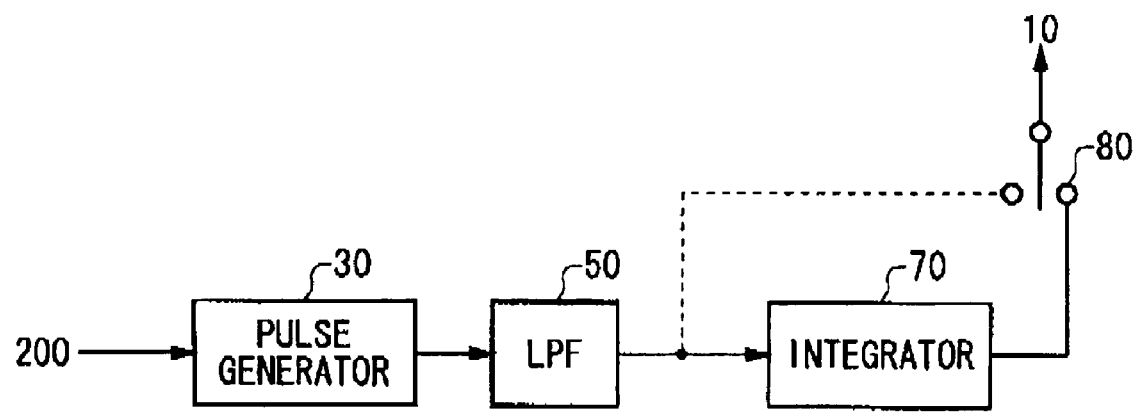
FIG. 5 is a diagram showing another exemplary configuration of the jitter demodulator 22.

FIG. 5 is a diagram showing another exemplary configuration of the jitter demodulator 22. The jitter demodulator 22 of this example is a circuit for demodulating timing jitter of the input signal and further includes an integrator 70 in addition to the configuration of the jitter demodulator 22 explained in connection with FIG. 3. The pulse generator 30 and the low-pass filter 50 are the same with the pulse generator 30 and the low-pass filter 50 shown in FIG. 3.

The integrator 70 demodulates the timing jitter of the input signal by integrating the period jitter outputted out of the low-pass filter 50. Although the jitter demodulator 22 shown in FIG. 5 has he configuration having the low-pass filter 50, the jitter demodulator 22 may be configured without the low-pass filter 50. For example, the integrator 70 receives the pulse signal outputted out of the pulse generator 30 and outputs a control signal whose signal level increases at a predetermined rate of increment during when the pulse signal shown in FIG. 4 presents a logic value H and whose signal level decreases with a predetermined rate of decrement during when the pulse signal presents a logic value L. Such operation enables the integrator 70 to demodulate the timing jitter of the input signal. However, the operation of the integrator 70 is not limited to this exemplary operation. The operation of the integrator 70 may be any operation as long as it allows demodulation of the timing jitter of the input signal. Still more, the low-pass filter 50 may be disposed at a post stage of the integrator 70.

The jitter demodulator 22 may further include a switch 80 for switching whether the period jitter or timing jitter of the input signal is to be outputted. The switch 80 selects either the period jitter outputted out of the low-pass filter 50 or the timing jitter outputted out of the integrator 70 and outputs it to the variable delay circuit 12.

Figure 6:
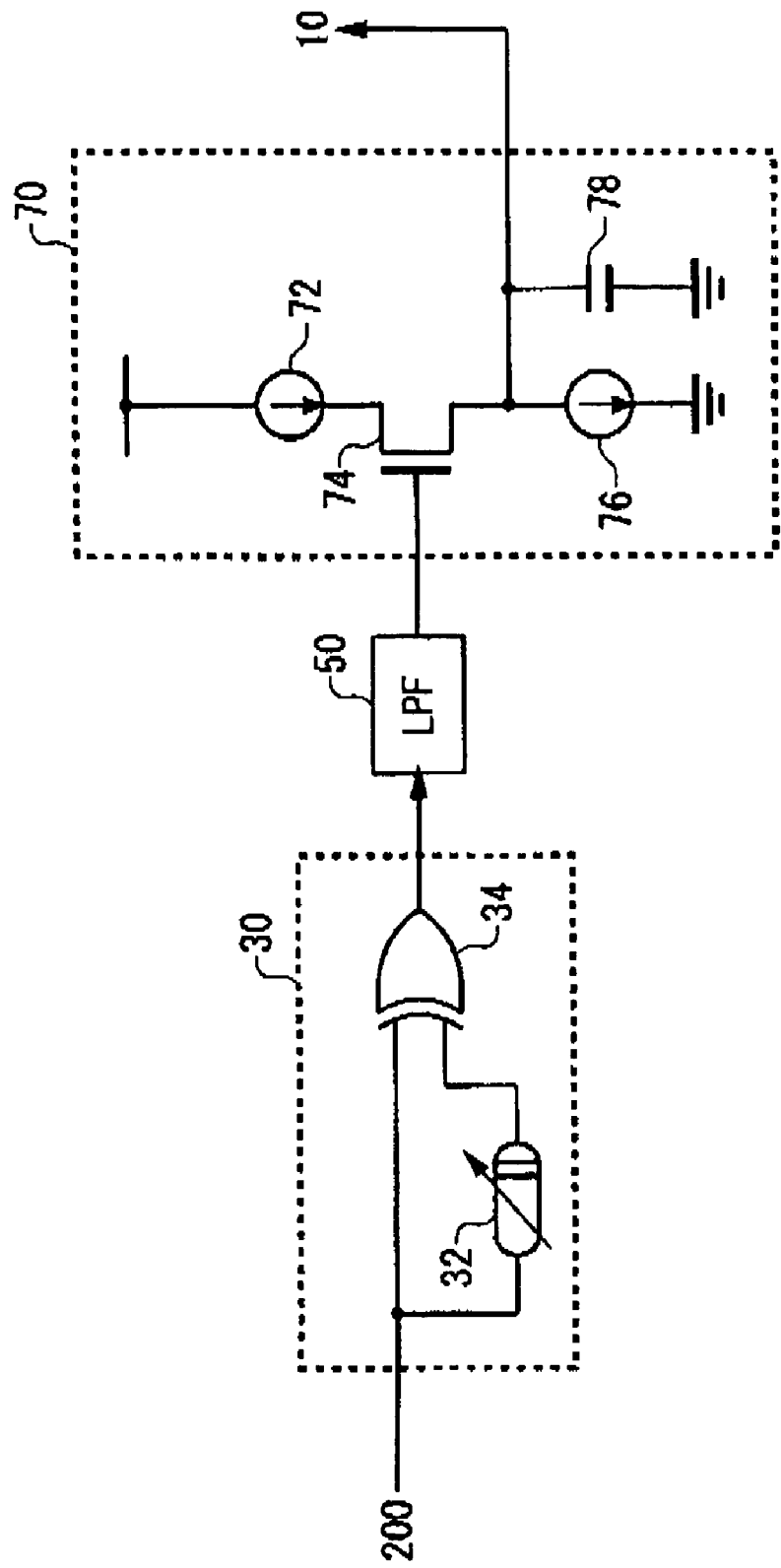
FIG. 6 is a diagram showing one detailed configuration of the jitter demodulator 22.
Figure 7:
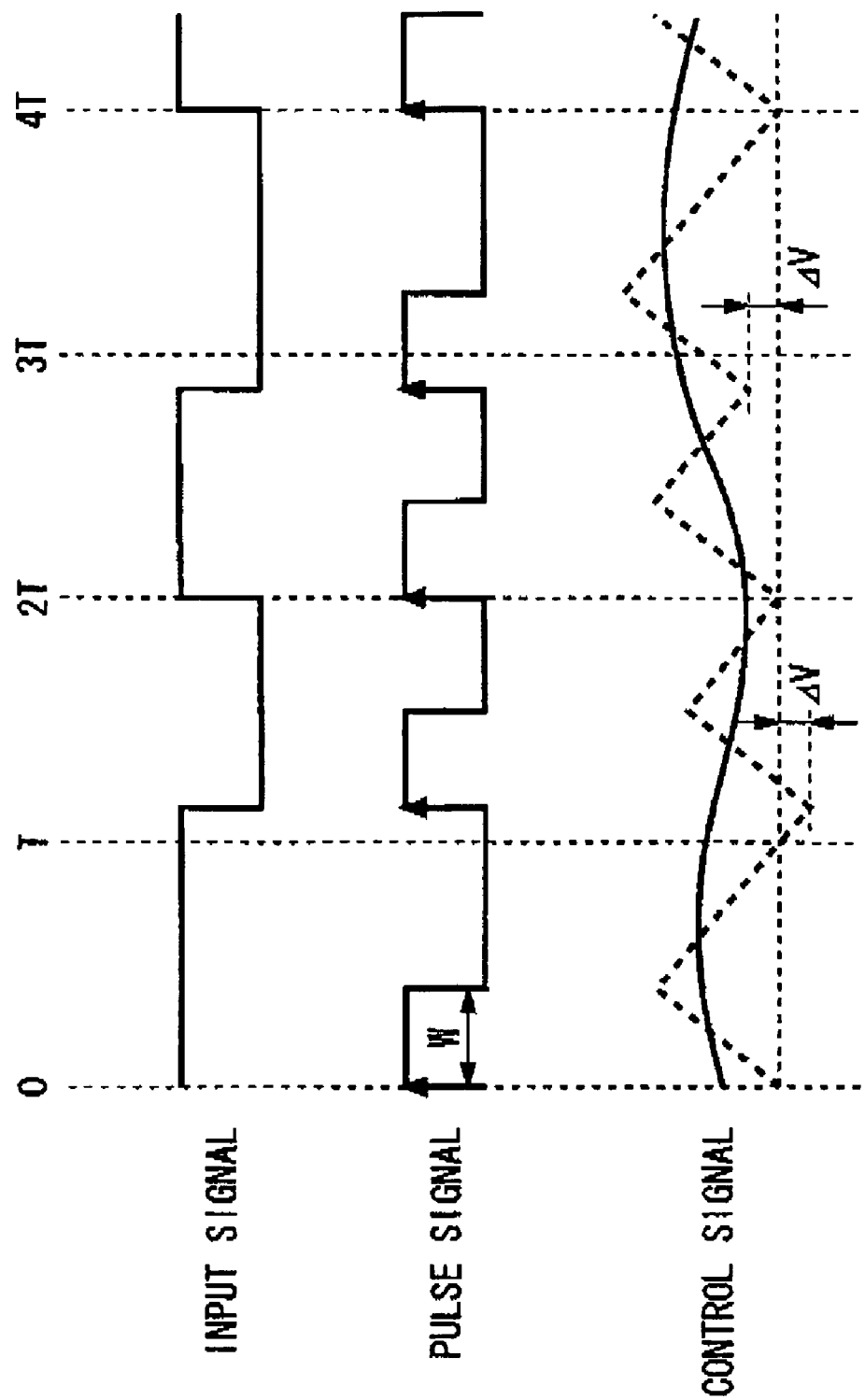
FIG. 7 is a chart showing one exemplary waveform of a control signal outputted out of an integrator 70 explained in FIG. 6.

FIG. 6 is a diagram showing one detailed configuration of the jitter demodulator 22. The pulse generator 30 of this example has a variable delay circuit 32 and an exclusive OR circuit 34. The variable delay circuit 32 delays the input signal with a value of delay corresponding to a pulse width W that the pulse signal outputted out of the pulse generator 30 should have. The exclusive OR circuit 34 outputs an exclusive OR of the input signal and a signal outputted out of the variable delay circuit 32. Such configuration allows the pulse signal as shown in FIG. 7 to be generated. However, the configuration of the pulse generator 30 is not limited to this configuration. For example, the pulse generator 30 may adopt a configuration using an AND circuit and others.

The integrator 70 of this example has a source current supply 72, a sink current supply 76, a capacitor 78 and a charge/discharge control section 74. The source current supply 72 generates source current specifying the rate of increment of the control signal described above and the sink current supply 76 generates sink current specifying the rate of decrement of the control signal described above.

By being charged/discharged by the source current supply 72 and the sink current supply 76, the capacitor 78 generates voltage level of the control signal. The charge/discharge control section 74 charges the capacitor based on the source current during when the pulse signal presents logic H and discharges the capacitor based on current obtained by subtracting the sink current from the source current during when the pulse signal present logic L.

Such configuration allows the generation of the control signal in which the timing jitter of the input signal is demodulated.

FIG. 7 is a chart showing one exemplary waveform of the control signal outputted out of the integrator 70 explained in FIG. 6. The pulse generator 30 of this example also outputs a pulse signal corresponding to rising edges and falling edges of an input signal.

The integrator 70 outputs the control signal whose signal level increases with the predetermined rate of increment during when the pulse signal presents the logic H and whose signal level decreases with the predetermined rate of decrement during when the pulse signal presents the logic L as described above. FIG. 7 shows the control signal by a dotted line. When the input signal is jitter-free, extreme values of the control signal presented by the dotted line find their predetermined levels. For example, the minimum value is on a level of almost zero and the maximum value is on a constant level. However, when the input signal has timing jitter, the respective extreme values have a difference ΔV corresponding to the value of jitter from the predetermined level as shown in FIG. 7.

It is possible to amplify or attenuate the timing jitter components by controlling the value of delay in the variable delay circuit 12 based on such control signal. The integrator 70 may also include a sample-and-hold circuit for sampling and holding the control signal corresponding to the edge of the input signal and supplying it to the variable delay circuit 12. The sample-and-hold circuit may pass and input the control signal to the variable delay circuit 12 dug when the signal outputted out of the pulse generator 30 presents the logic H and may hold and input the signal level of the control signal to the variable delay circuit 12 during when the signal outputted out of the pulse generator 30 presents the logic L.

The integrator 70 may further include an averaging circuit for averaging the control signal and for supplying it to the variable delay circuit 12. A waveform of the control signal presented by a solid line in FIG. 7 is the waveform outputted out of the averaging circuit.

The averaging circuit may remove a preset high-frequency component of the control signal. For example, the averaging circuit may output a moving average value of the timing jitter of the input signal by time-averaging the control signal. Still more, the averaging circuit may output the moving average value of the timing jitter by removing a component of a signal outputted out of the integrator 70 when the input signal is jitter-free from the control signal outputted out of the integrator 70. The averaging circuit may realize the above-mentioned functions by using a low-pass filter for example.

Figure 8:
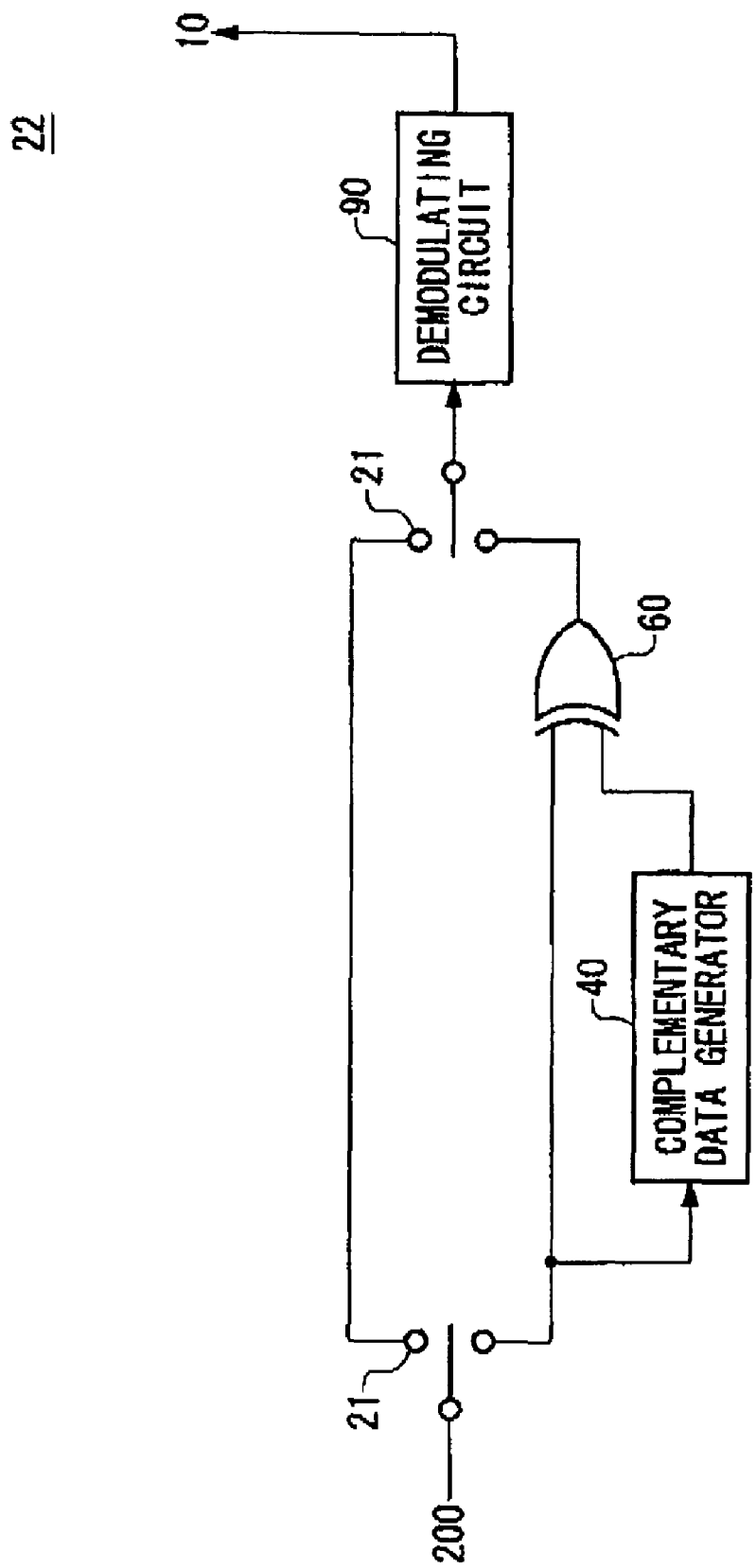
FIG. 8 is a diagram showing a still other exemplary configuration of the jitter demodulator 22.

FIG. 8 is a diagram showing a still other exemplary configuration of the jitter demodulator 22. In this example, the input signal is a data signal and the jitter demodulator 22 demodulates jitter of the data signal. The jitter demodulator 22 of this example has a complementary data generator 40, an exclusive OR circuit 60 and a demodulating circuit 90.

The complementary data generator 40 generates a complementary data signal whose data value transits at a bit boundary where data value of the data signal does not change.

The exclusive OR circuit 60 outputs an exclusive OR of the data signal and the complementary data signal.

The demodulating circuit 90 demodulates jitter of a signal outputted out of the exclusive OR circuit 60. The demodulating circuit 90 may have the same configuration with the jitter demodulator 22 explained in connection with FIG. 3 or with the jitter demodulator 22 explained in connection with FIG. 5.

Figure 9:
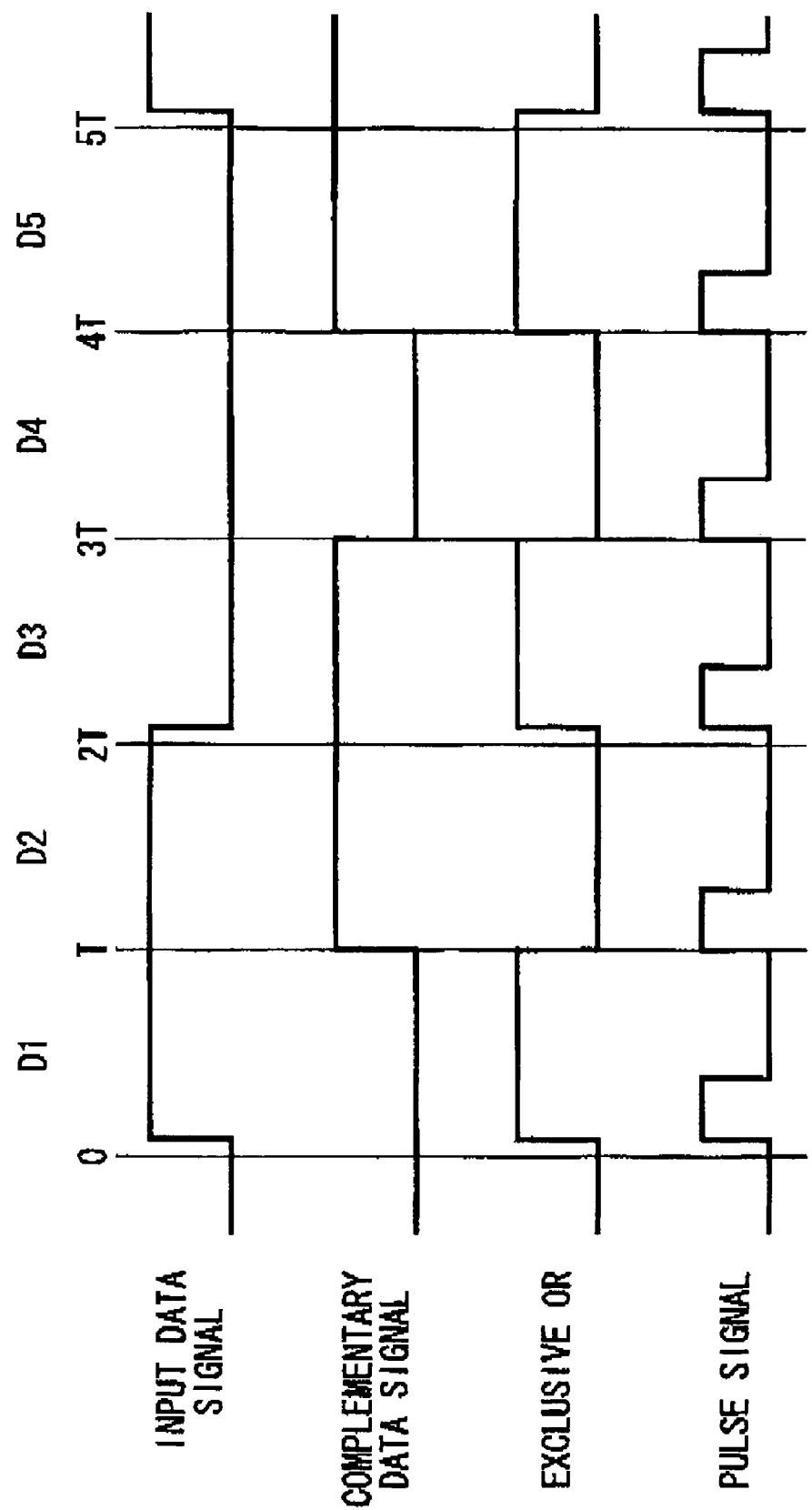
FIG. 9 is a timing chart showing one exemplary operation of a complementary data generator 40.

FIG. 9 is a timing chart showing one exemplary operation of the complementary data generator 40. Receiving the input data signal, the complementary data generator 40 generates a complementary data signal of the input data signal. The complementary data signal is a signal whose edge is provided per boundary of data sections of the input data signal under the condition that a data value of the input data signal does not transit at the boundary of the data section. For example, when edges of the input data signal and those of the complementary data signal are aligned with each other along the time axis, the complementary data signal may be a signal whose edges are arrayed almost at equal time intervals. The data section of the input data signal refers to a time during which one non-continuous data is held in the input data signal serially transmitted for example. In an input data signal that is multi-valued and transmitted, the data section may refer to a time during which symbol data is held. That is, the data section may be a bit interval or may be a symbol interval of the input data signal. For example, the data section of the input data sisal is T and a data pattern in a time (0-6T) is 110001 in FIG. 9.

In the example shown in FIG. 9, sections (0-T, T-2T, 3T4T, . . . ) correspond to the data sections (D1, D2, D3, . . . ). The boundaries of the respective data sections are (0, T, 2T, 3T, . . . ). In this example, the data value of the input data signal transit at the boundaries (0, 2T, 5T) of the data sections and no data value of the input data signal transits at the boundaries (T, 3T, 4T) of the data sections. Therefore, the complementary data generator 40 generates the complementary data signal having edges at the boundaries (T, 3T, 4T) of the data sections where no edge of the input data signal exists.

Because the input data signal has the almost constant data sections, timing of the edges of the input data signal is almost same with either one of the timings (0, T, 2T, . . . ). In such a case, preferably, the complementary data generator 40 generates the complementary data signal having edges at the boundaries of the data sections where no edge of the input data signal exists. Thereby, as for the edges of the both input data signal and complementary data signal, the edges are arrayed almost at constant intervals. Such operation enables the jitter demodulator 22 to operate almost at constant intervals, to reduce variance of its output which is otherwise caused by the difference of operating intervals and others and to accurately demodulate jitter.

The exclusive OR circuit 60 outputs an exclusive OR of the input data signal and the complementary data signal. Thereby, a signal in which edges are arrayed almost constant intervals may be generated. The jitter components of the input data signal are kept in this signal.

The demodulating circuit 90 outputs a pulse signal corresponding to the edges of the signal and demodulates the jitter components based on the pulse signal. When a control signal dependent on the jitter of the complementary data signal is outputted to the variable delay circuit 12, data of the data signal inputted to the variable delay circuit 12 does not transit. Therefore, even when the delay time of the variable delay circuit 12 changes corresponding to the jitter of the complementary data signal, it has no influence on a waveform of the output signal of the variable delay circuit 12. That is, even if jitter is contained in the complementary data signal, it is possible to remove the influence of the jitter and to generate an output signal in which the jitter contained in the input data signal is amplified or attenuated.

Figure 10:
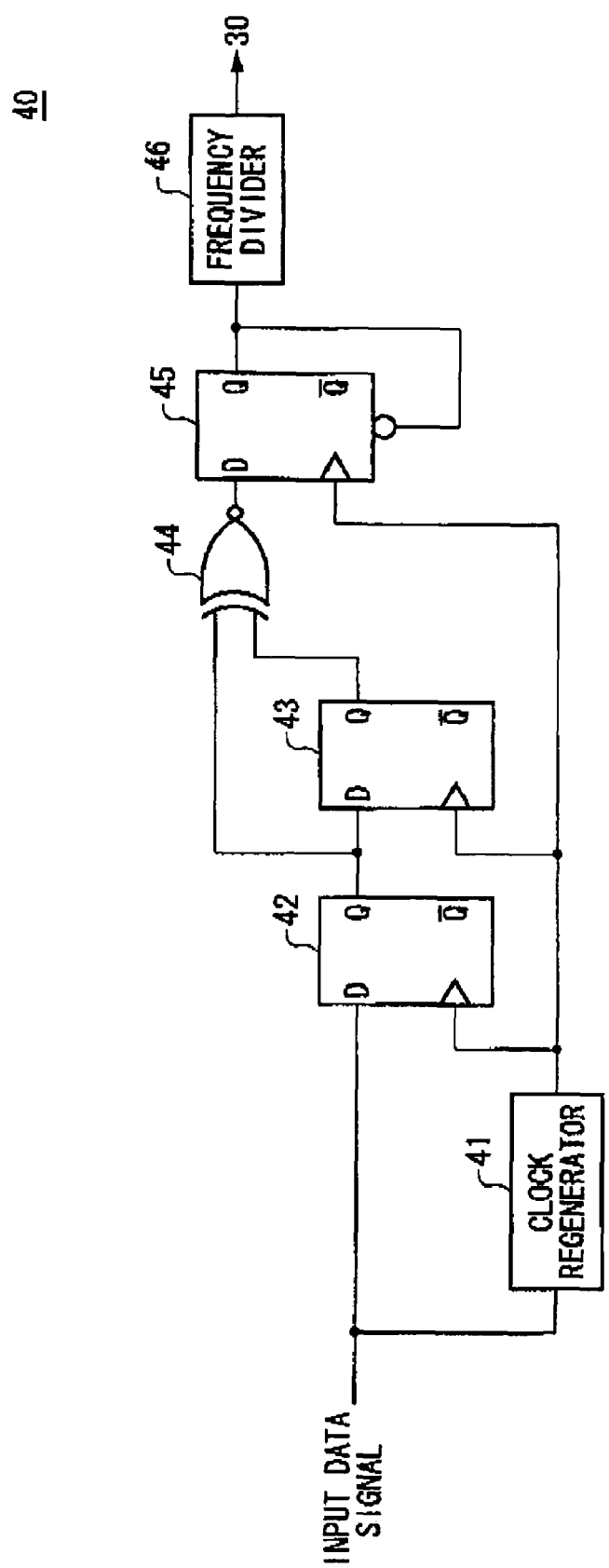
FIG. 10 is a diagram showing one exemplary configuration of the complementary data generator 40.

FIG. 10 is a diagram showing one exemplary configuration of the complementary data generator 40. The complementary data generator 40 of this example has a clock regenerator 41, a first D flip-flop 42, a second D flip-flop 43, a coincidence detector 44, a third D flip-flop 45 and a frequency divider 46.

The clock regenerator 41 generates a clock signal having the almost same period with a data section of the input data signal based on the input data signal. The first D flip-flop 42 takes in and outputs the input data signal corresponding to the clock signal.

The second D flip-flop 43 takes in and outputs a signal outputted out of the first D flip-flop 42 corresponding to the clock signal. That is, the second D flip-flop 43 outputs the signal outputted out of the second D flip-flop 43 by delaying by one period of the data section of the input data signal.

The coincidence detector 44 outputs a coincident signal presenting logic H when a value of the signal outputted out of the first D flip-flop 16 coincides with a value of the signal outputted out of the second D flip-flop 18.

The third D flip-flop 45 takes in and outputs the signal outputted out of the coincidence detector 44 corresponding to the clock signal. The output signal resets the internal data That is, the third D flip-flop 45 outputs a pulse having a small pulse width that is shorter than the data section of the input data signal when the signal received from the coincidence detector 44 presents a logic value H when in receiving a rising edge of the clock signal.

The frequency divider 46 divides frequency of the signal outputted out of the third D flip-flop 45 by two to generate the complementary data signal. Here, dividing frequency by two means to generate a signal whose logic value transits corresponding to either the rising edge or the falling edge of the signal outputted out of the third D flip-flop 45.

Such configuration allows the complementary data signal of the input data signal to be readily generated. The configuration of the complementary data generator 40 is not limited to the exemplary configuration described above. The complementary data generator 40 may be configured variously.

Figure 11:
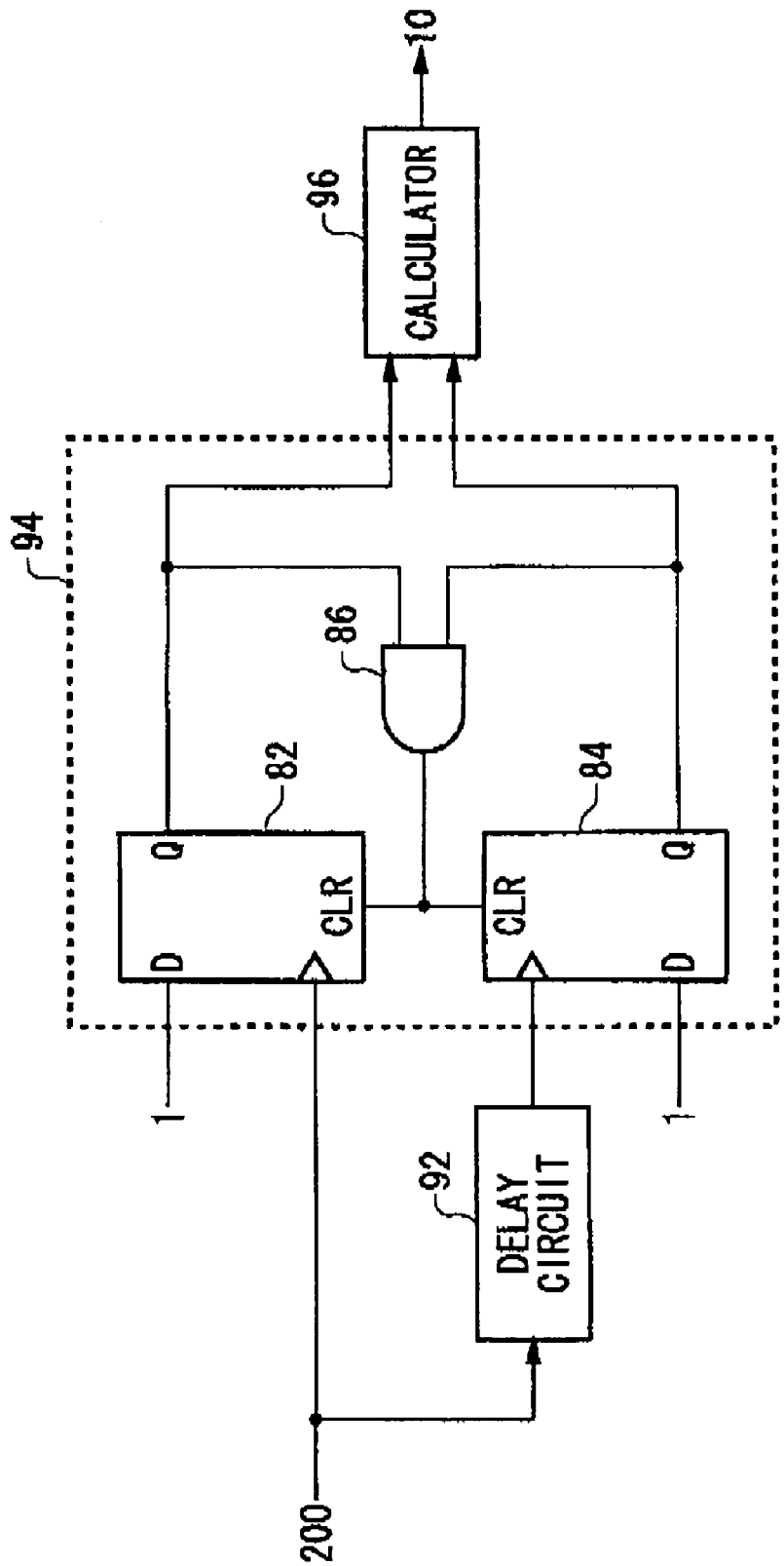
FIG. 11 is a diagram showing another exemplary configuration of the jitter demodulator 22.

FIG. 11 is a diagram showing another exemplary configuration of the jitter demodulator 22. The jitter demodulator 22 of this example has a delay circuit 92 and a phase detector 94. The delay circuit 92 receives a split input signal and outputs the received input signal by delaying by a predetermined time. The phase detector 94 detects a phase difference between the input signal from the device-under-test 200 and the signal outputted out of the delay circuit 92 and outputs jitter components based on the phase difference.

The phase detector 94 may outputs a pulse signal having a pulse width corresponding to the phase difference of the two given signals for example.

Here, when the input signal is a clock signal having a constant period, a case when the delay circuit 92 delays the input signal by one period will be explained. When the clock signal is jitter-free in such a case, the phase detector 94 detects no phase difference, so that the phase detector 94 output no pulse signal. However, when the clock signal has jitter, the phase detector 94 outputs a pulse signal having a pulse width corresponding to a difference between timing jitter at a n-th rising edge of the clock signal and timing jitter at (n+1)-th rising edge for example. That is, the phase detector 94 outputs the pulse signal corresponding to the period jitter of the clock signal. Still more, because the timing jitter is what the period jitter is accumulated, the phase detector 94 may output the timing jitter by having means for accumulating the period jitter.

Furthermore, the phase detector 94 may output two pulse signals corresponding to both cases when phase of a first given signal is in advance of and is delayed from phase of a second given signal. In this case, the phase detector 94 may have a flip-flop 82, a flip-flop 84 and an AND circuit 86 as shown in FIG. 11.

The flip-flop 82 receives the input signal as operating clock and receives a logic value 1 at its data input terminal. The flip-flop 84 also receives the signal outputted out of the delay circuit 92 as operating clock and receives a logic value 1 at its data input terminal. The AND circuit 86 inputs AND of outputs of the flip-flop 82 and the flip-flop 84 to clear terminals of the flip-flop 82 and the flip-flop 84.

The case when phase of the input signal (referred to as a first signal hereinafter) is advanced of phase of the signal (referred to as a second signal hereinafter) outputted out of the delay circuit 92 will be explained at first. In this case, the flip-flop 82 outputs a logic value 1 corresponding to a rising edge of the first signal. Then, the flip-flop 84 outputs a logic value 1 corresponding to a rising edge of the second signal. Here, the outputs of the both flip-flops are logic value 1, the outputs of the both flip-flops are cleared by the AND circuit 86. Therefore, the flip-flop 82 outputs the logic value 1 during a period from the rising edge of the first signal to the rising edge of the second signal.

When the phase of the first signal is delayed from the phase of the second signal, the flip-flop 84 outputs the logic value 1 during a period from the rising edge of the second signal to the rising edge of the first signal in the same manner.

The variable delay circuit 12 may adjust the value of delay based on the signals outputted out of the flip-flop 82 and the flip-flop 84. That is, the variable delay circuit 12 may decrease or increase the value of delay corresponding to the pulse width of the signal outputted out of the flip-flop 82 and may decrease or increase the value of delay corresponding to the pulse width of the signal outputted out of the flip-flop 84.

The jitter demodulator 22 may also include a calculator 96 for calculating the period jitter or timing jitter of the input signal based on the signal outputted out of the phase detector 94. For example, the calculator 96 may generate a signal presenting the period jitter of the input signal by charging the capacitor with predetermined current during when the signal outputted out of the flip-flop 82 presents the logic value 1 and by discharging the capacitor by the predetermined current during when the signal outputted out of the flip-flop 84 presents the logic value 1. Still more, it may generate a signal presenting the timing jitter of the input signal by accumulating and adding the period jitter. The calculator 96 may control the value of delay in the variable delay circuit 12 by the signal presenting the period jitter or timing jitter.

The case when the value of delay in the delay circuit 92 coincides with the period of the input signal has been explained above. A case when the value of delay in the delay circuit 92 does not coincide with the period of the input signal will be explained below.

Here, the value of delay in the delay circuit 92 is denoted as D and the period of the input signal as T. In such a case, each pulse width of the pulse signal outputted out of the phase detector 94 has a difference T–D to each pulse width of the pulse signal outputted out of the phase detector 94 when the value of delay in the delay circuit 92 described above is one period of the input signal.

In this case, the signal outputted out of the calculator 96 contains a noise component corresponding to the jitter components of the input signal and a linear component corresponding to the difference T–D. The calculator 96 may output the jitter components of the input signal by removing the linear component and by sampling the noise component.

The jitter demodulator 22 may also include a sample-and-hold circuit for sampling and holding level of the signal outputted out of the calculator 96 with a period corresponding to an ideal period of the input signal and supplying it to the variable delay circuit 12. It allows the jitter of the input signal to be amplified or attenuated more accurately.

Figure 12:
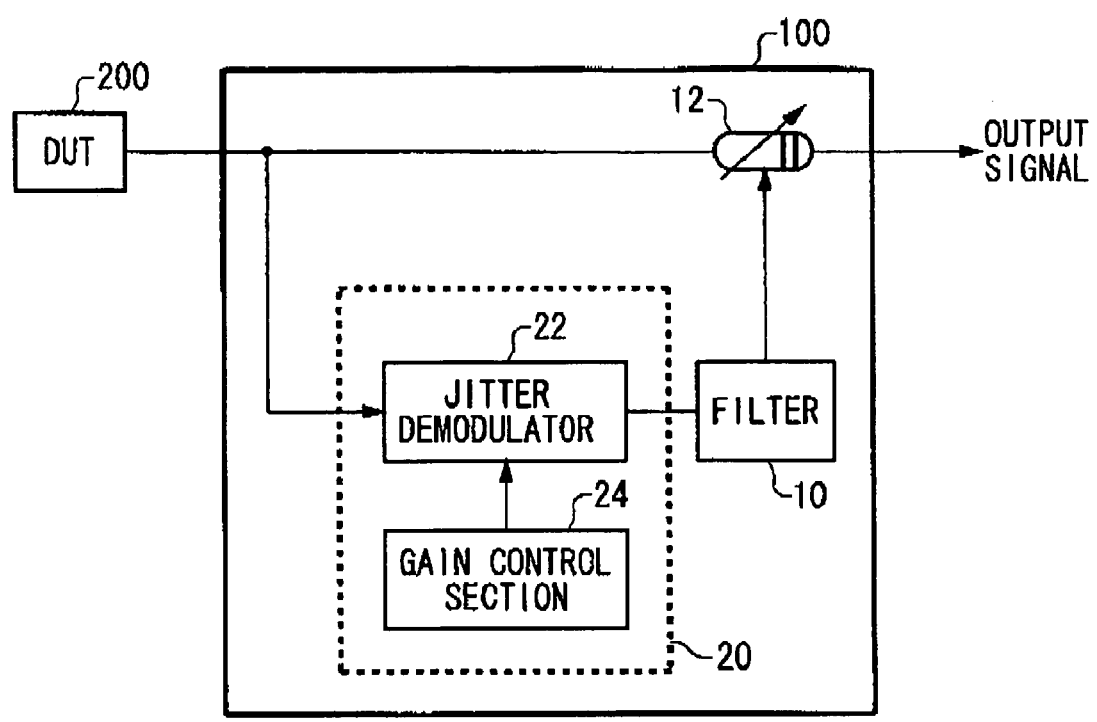
FIG. 12 is a diagram showing another configuration of a jitter filtering circuit 100.

FIG. 12 is a diagram showing another configuration of the jitter filtering circuit 100. The jitter filtering circuit 100 of this example is different from the jitter filtering circuit 100 explained in connection with FIG. 1 in the configuration of the extracting section 20.

The variable delay circuit 12 is the same with the variable delay circuit 12 explained in connection with FIG. 1.

The extracting section 20 of this example further includes again control section 24 in addition to the configuration of the extracting section 20 explained in connection with FIG. 1. The jitter demodulator 22 is the same with the jitter demodulator 22 explained in connection with FIG. 1.

The gain control section 24 controls at least one of the gain of the jitter demodulator 22 and the gain of the variable delay circuit 12 so that a product of the gains of the jitter demodulator 22 and the variable delay circuit 12 becomes −1.

The gain control section 24 of this example controls the gain of the jitter demodulator 22. The gain of the jitter demodulator 22 the rate of increment of the jitter components outputted out of the jitter demodulator 22 to the jitter components contained in the input signal as described above.

The gain control section 24 may control the gain by controlling circuit parameters of the jitter demodulator 22. In this case, the gain control section 24 may control the gain by controlling the value of current in the source current supply 72 and the sink current supply 76 explained in FIG. 6 for example.

The gain control section 24 may also have means for amplifying or attenuating the signal outputted out of the jitter demodulator 22 and may control the gain to the jitter components by other means.

Figure 13:
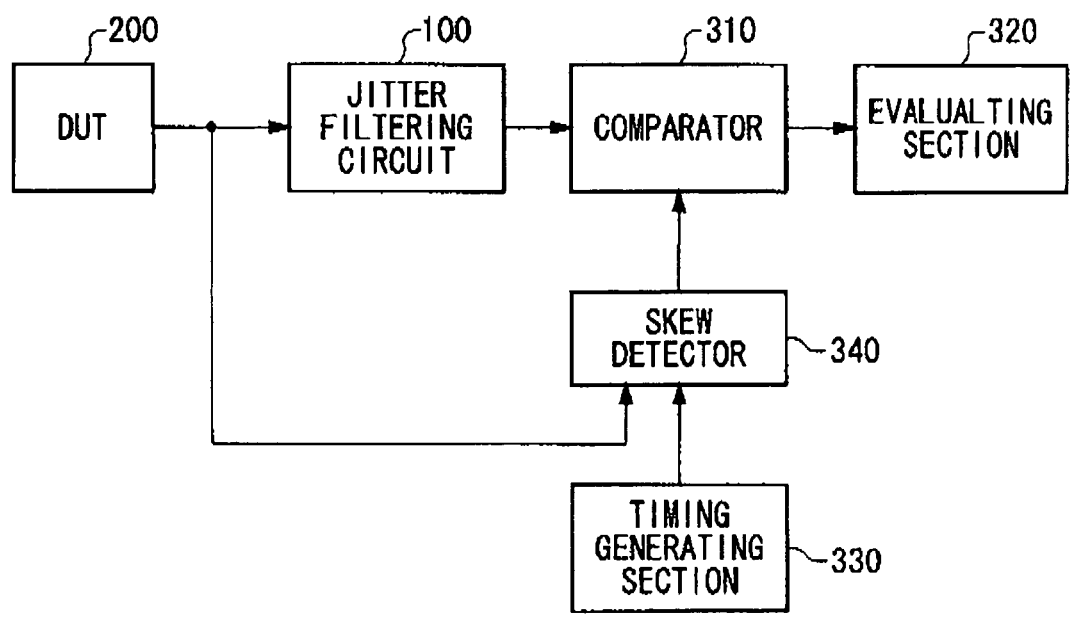
FIG. 13 is a diagram showing another configuration of the testing apparatus 300.

FIG. 13 is a diagram showing another configuration of the testing apparatus 300. The testing apparatus 300 of this example further includes askew detector 340 in addition to the configuration of the testing apparatus 300 explained in connection with FIG. 1. The other components are the same with the components denoted by the same reference numerals in FIG. 1.

The skew detector 340 detects a phase difference between the output signal of the device-under-test 200 and the timing signal outputted out of the timing generating section 330. For example, the skew detector 340 sets an edge of the timing signal as a start trigger and an edge of the output signal as a stop trigger and measures a time interval from the start trigger to the stop trigger. The skew detector 340 may measure the time interval by using a counter for example.

The skew detector 340 may control comparing timing of the comparator 310 based on the detected skew. For example, the testing apparatus 300 measures respective output signals of the device-under-test 200 almost in the same time in testing the multi-lane device-under-test 200. In this case, the testing apparatus 300 has a plurality of jitter filtering circuits 100 and comparators 310 corresponding to the plurality of output signals.

Each of the skew detector 340 is provided corresponding to each of the plurality of comparators 310 and detects skew between the corresponding output signal and the timing signal to be given to the corresponding comparator 310. Then, it supplies the timing signal in which the difference of each skew is compensated to the corresponding comparator 310.

Such configuration allows the multi-lane device-under-test 200 to be accurately tested.

Figure 14:
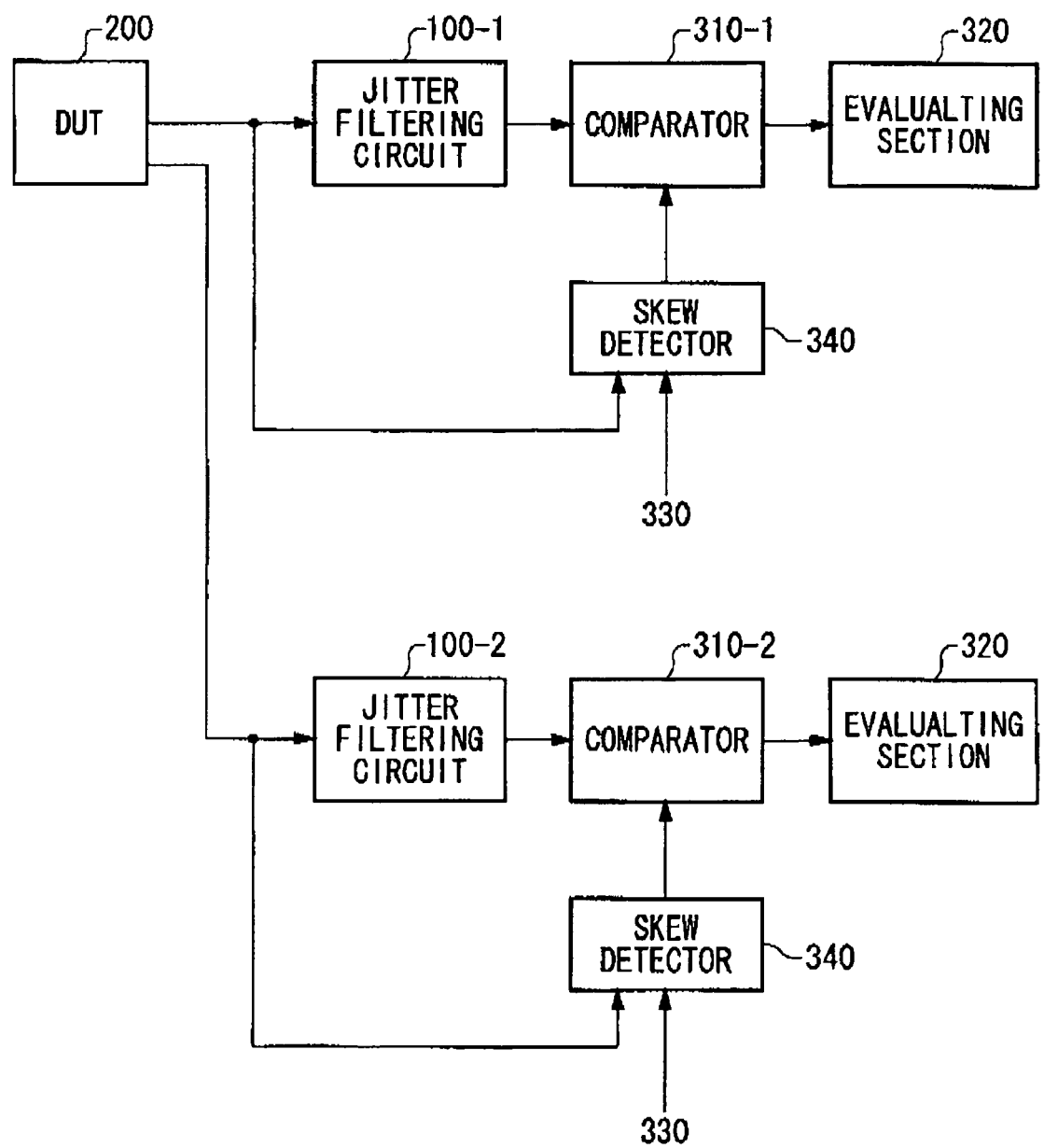
FIG. 14 is a diagram showing a still other configuration of the testing apparatus 300.

FIG. 14 is a diagram showing a still other configuration of the testing apparatus 300. The testing apparatus 300 of this example tests the multi-lane device-under-test 200. The testing apparatus 300 has the plurality of jitter filtering circuits (100-1 and 100-2, generally denoted as 100 hereinafter), the plurality of comparators (310-1 and 310-2, generally denoted as 310 hereinafter), evaluating sections 320, the skew detectors 340 and a timing generating section 330 as described above.

The plurality of jitter filtering circuits 100 and the plurality of comparators 310 are provided in parallel corresponding to the plurality of output signals outputted out of the device-under-test 200. The skew detector 340 detects skew between each output signal and the timing signal. Then, phase of the timing signal given to each comparator 310-1 is adjusted so as to reduce variance of the skew. The skew detector 340 may be provided corresponding to each comparator 310-1.

Such configuration allows the multi-lane device-under-test 200 to be accurately tested.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

For example, although the examples in which the jitter filtering circuit 100 is provided in the testing apparatus 300 have been explained in FIGS. 1 through 14, the jitter filtering circuit 100 may be provided in the device-under-test 200. For example, the device-under-test 200 may be provided with the operating circuit for generating the output signal and the jitter filtering circuit 100 for receiving the output signal. It is possible to test the device-under-test 200 by a testing apparatus having no clock recovery circuit by removing jitter components of predetermined frequency from the output signal by using the jitter filtering circuit 100 in testing the device-under-test 200. Still more, the jitter filtering circuit 100 may pass the output signal in actually using the device-under-test 200. That is, the jitter filtering circuit 100 is arranged so that a product of the gains of the jitter demodulator 22 and the variable delay circuit 12 in the jitter filtering circuit 100 is zeroed.

As it is apparent from the above description, the invention allows the device-under-test to be tested by measuring the eye diagram of the device-under-test without using the real-time oscilloscope whose cost is high and whose test time is long. It thus allows the reduction of the testing cost.

Still more, because it allows the eye diagram of the device-under-test to be measured without using the clock recovery circuit, it can prevent the circuit configuration of the testing apparatus from becoming complicated. It thus allows the reduction of the testing cost. It also allows the multi-lane device-under-test to be tested at low cost.

It further allows the reduction of variance of skew of each signal-under-measurement and timing signal in testing the multi-lane device-under-test. Therefore, it allows multi-lane serial I/O interfaces whose propagation delay differs to be tested in the same time by using single reference timing, thus reducing a testing time and cost.

What is claimed is:

1. A testing apparatus for evaluating a device-under-test, comprising:
    an extracting section for extracting jitter components of an output signal of said device-under-test;
    a filter for passing predetermined frequency components in said jitter components;
    a phase control section for controlling phase of said output signal based on said jitter components output from said filter; and
    an evaluating section for evaluating said device-under-test based on a signal output of said phase control section.

2. The testing apparatus as set forth in claim 1, wherein said phase control section has a variable delay circuit for delaying and outputting said output signal by an amount of delay based on said jitter components passed by said filter.

3. The testing apparatus as set forth in claim 2, wherein said filter has substantially the same filtering characteristics as those of a clock recovery circuit configured to receive the output signal from said device-under-test and, when a recovered clock of said output signal is generated by using said clock recovery circuit, generates a signal corresponding to the jitter components contained in said recovered clock; and
    said variable delay circuit delays said output signal so as to remove said jitter components output from said filter from said output signal.

4. The testing apparatus as set forth in claim 2, further comprising a comparator for comparing a voltage value of a signal output from of said variable delay circuit with a predetermined reference voltage corresponding to a given timing signal; wherein said evaluating section evaluates said device-under-test based on the comparison result of said comparator.

5. The testing apparatus as set forth in claim 4, further comprising a timing generating section for providing said timing signal at constant period.

6. The testing apparatus as set forth in claim 5, further comprising a skew detector for detecting a phase difference of said output signal and said timing signal.

7. The testing apparatus as set forth in claim 6, further comprising a plurality of extracting sections, filters, variable delay circuits and comparators in parallel; wherein said skew detector detects said phase difference in each of said comparators.

8. The testing apparatus as set forth in claim 2, wherein a gain of a value of delay of said output signal to said jitter components output from of said filter in said variable delay circuit is variable.

9. The testing apparatus as set forth in claim 1, wherein said extracting section has a jitter demodulator for demodulating said jitter components from said output signal.

10. The testing apparatus as set forth in claim 9, wherein said jitter modulator has
   a delay circuit for outputting a delay signal obtained by delaying said output signal by a predetermined time; and
   a phase detector for detecting a phase difference between said output signal and said delay signal and for outputting said jitter components based on said phase difference.

11. The testing apparatus as set forth in claim 9, wherein said jitter demodulator has
   a pulse generator for outputting a pulse signal having a pulse width set in advance corresponding to edges of said output signal; and
   a low-pass filter for demodulating said jitter components of said output signal by removing a carrier frequency component of said output signal.

12. The testing apparatus as set forth in claim 9, wherein said jitter demodulator has
   a pulse generator for outputting a pulse signal having a pulse width set in advance corresponding to edges of said output signal; and
   an integrator for demodulating said jitter components of said output signal by integrating said pulse signal.

13. The testing apparatus as set forth in claim 9, wherein said output signal is a data signal; and
   said jitter demodulator has
   a complementary data generator for generating a complementary data signal whose data value transits at bit boundary where a data value of said data signal does not transit;
   an exclusive OR circuit for outputting an exclusive OR of said data signal and said complementary data signal; and
   a demodulating circuit for demodulating jitter of a signal output from of said exclusive OR circuit.

14. The testing apparatus as set forth in claim 9, wherein a gain of said jitter components to be output to said input jitter components of said jitter demodulator is variable.

15. The testing apparatus as set forth in claim 1, wherein said filtering characteristic of said filter is variable.

16. A testing method for evaluating a device-under-test; comprising:
   extracting jitter components out of an output signal output from said device-under-test;
   filtering to pass predetermined frequency components in said jitter components;
   controlling phase of said output signal based on said jitter components output during filtering; and
   evaluating said device-under-test based on a signal output while controlling phase.

17. A jitter filtering circuit for controlling phase of an input signal based on jitter components contained in said input signal, comprising:
   an extracting section for extracting the jitter components from the input signal;
   a filter for passing predetermined frequency components in said jitter components; and
   a phase control section for controlling phase of said input signal based on said jitter components output from said filter.

18. A jitter filtering method for controlling phase of an input signal based on jitter components contained in said input signal, comprising:
   extracting the jitter components from the input signal;
   filtering to pass predetermined frequency components in said jitter components; and
   controlling phase of said input signal based on said jitter components output during filtering.

* * * * *